United States Patent
Bedeschi et al.

(10) Patent No.: US 11,495,321 B2
(45) Date of Patent: **\*Nov. 8, 2022**

(54) METHOD FOR SETTING A REFERENCE VOLTAGE FOR READ OPERATIONS

(71) Applicant: Micron Technology, Inc., Boise, ID (US)

(72) Inventors: Ferdinando Bedeschi, Biassono (IT); Umberto Di Vincenzo, Capriate San Gervasio (IT); Riccardo Muzzetto, Arcore (IT)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/387,335

(22) Filed: Jul. 28, 2021

(65) Prior Publication Data

US 2022/0020448 A1    Jan. 20, 2022

Related U.S. Application Data

(63) Continuation of application No. 16/908,303, filed on Jun. 22, 2020, now Pat. No. 11,081,204.

(51) Int. Cl.
*G11C 29/42* (2006.01)
*G11C 29/44* (2006.01)
(Continued)

(52) U.S. Cl.
CPC .............. *G11C 29/42* (2013.01); *G11C 5/025* (2013.01); *G11C 11/4074* (2013.01);
(Continued)

(58) Field of Classification Search
CPC ....... G11C 29/42; G11C 5/025; G11C 29/021; G11C 11/4091; G11C 29/44; G11C 11/4074
See application file for complete search history.

(56) References Cited

U.S. PATENT DOCUMENTS 10,790,031 B1 * 9/2020 Sagdeo .................. G11C 29/42
11,081,204 B1 * 8/2021 Bedeschi ............. G11C 29/021
(Continued)

FOREIGN PATENT DOCUMENTS

CN    105097028 A    11/2015
CN    107799148 A    3/2018

OTHER PUBLICATIONS

Chinese Patent Office, "Office Action and Search Report", issued in connection with Chinese Patent Application No. 202110648571.6 dated May 24, 2022 (15 pages).

*Primary Examiner* — Tri M Hoang
(74) *Attorney, Agent, or Firm* — Holland & Hart LLP

(57) ABSTRACT

Methods, systems, and devices for method for setting a reference voltage for read operations are described. A memory device may perform a first read operation on a set of memory cells using a first reference voltage and detect a first codeword based on performing the first read operation using the first reference voltage. The memory device may compare a first quantity of bits of the first codeword having a first logic value (e.g., a logic value '1') with an expected quantity of bits having the first logic value (e.g., the expected quantity of logic value '1's stored by the set of memory cells). The memory device may determine whether to perform a second read operation on the set of memory cells using a second reference voltage different than the first reference voltage (e.g., greater or less than the first reference voltage) based on the comparing.

20 Claims, 10 Drawing Sheets

(51) Int. Cl.
  *G11C 5/02* (2006.01)
  *G11C 11/4074* (2006.01)
  *G11C 11/4091* (2006.01)
  *G11C 29/02* (2006.01)

(52) U.S. Cl.
  CPC ........ *G11C 11/4091* (2013.01); *G11C 29/021* (2013.01); *G11C 29/44* (2013.01)

(56) References Cited

U.S. PATENT DOCUMENTS

| | | |
|---|---|---|
| 2007/0201274 A1 | 8/2007 | Yu et al. |
| 2011/0182119 A1 | 7/2011 | Strasser et al. |
| 2012/0084490 A1 | 4/2012 | Choi et al. |
| 2015/0332777 A1 | 11/2015 | Yoon et al. |
| 2018/0068736 A1 | 3/2018 | Kim |

* cited by examiner

METHOD FOR SETTING A REFERENCE VOLTAGE FOR READ OPERATIONS

CROSS REFERENCE

The present Application for Patent is a continuation of U.S. patent application Ser. No. 16/908,303 by Bedeschi et al., now U.S. Pat. No. 11,081,204, entitled "METHOD FOR SETTING A REFERENCE VOLTAGE FOR READ OPERATIONS," filed Jun. 22, 2020, assigned to the assignee hereof, and is expressly incorporated by reference in its entirety herein.

BACKGROUND

The following relates generally to one or more systems for memory and more specifically to method for setting a reference voltage for read operations.

Memory devices are widely used to store information in various electronic devices such as computers, wireless communication devices, cameras, digital displays, and the like. Information is stored by programming memory cells within a memory device to various states. For example, binary memory cells may be programmed to one of two supported states, often denoted by a logic 1 or a logic 0. In some examples, a single memory cell may support more than two states, any one of which may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read-only memory (ROM), dynamic RAM (DRAM), synchronous dynamic RAM (SDRAM), FeRAM, magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source. FeRAM may be able to achieve densities similar to volatile memory but may have non-volatile properties due to the use of a ferroelectric capacitor as a storage device.

DETAILED DESCRIPTION

Figure 1:
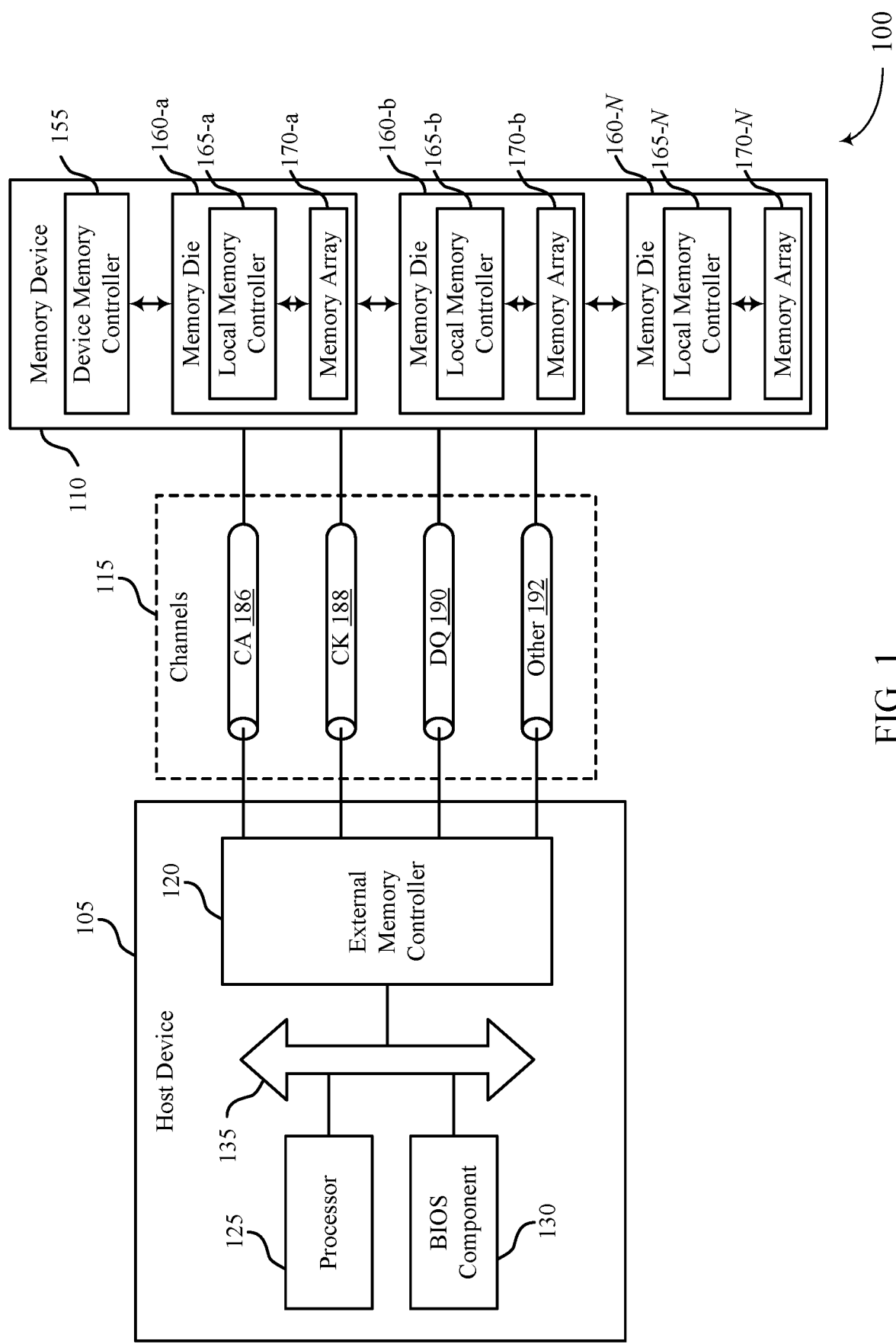
FIG. 1 illustrates an example of a system that supports method for setting a reference voltage for read operations in accordance with examples as disclosed herein.

When performing a read operation, a memory device may access a memory cell that may output a signal to a sense component based on a value stored by the memory cell. To determine the value stored by the memory cell, the sense component may compare the signal output by the memory cell to a reference voltage. Here, the reference voltage may correspond to a voltage positioned between an expected voltage level of the signal output by a memory cell storing a first logic value and an expected voltage level of the signal output by a memory cell storing a second logic value. Thus, the memory device may determine that the memory cell was storing a first logic value if the signal output by the memory cell is less than the reference voltage. Additionally, the memory device may determine that the memory cell was storing a second logic value if the signal output by the memory cell is greater than the reference voltage. In some cases, the signal output by the memory device may be different than the expected voltage level associated with the value stored by the memory cell. For example, the memory cell may be storing a stuck bit. In another example, the characteristic of the memory cell may change over time, resulting in a corresponding change in the signal output by the memory cell based on the value stored by the memory cell. In some other examples, the signal output by a memory cell may change from the expected value based on other operating conditions (e.g., temperature). Such unintentional changes in the state stored in the memory cell may be referred to as errors. In these cases, comparing the signal output by the memory cell to a single reference voltage may result in one or more errors during the read operation.

In examples described herein, the memory device may be configured to dynamically adjust a reference voltage used during a read operation. For example, the memory device may perform a read operation on a set of memory cells to detect a codeword stored by the set of memory cells. The memory device may identify a quantity of bits within the detected codeword that are a first logic value (e.g., a logic value '1') and may compare the quantity of bits within the detected codeword to an expected quantity of bits within the codeword that are the first logic value. Based on comparing the quantity of bits within the detected codeword to the expected quantity of bits within the codeword that are the first logic value, the memory device may determine whether to adjust the reference voltage and perform a second read operation on the set of memory cells. In some cases, the memory device may additionally perform an error control operation to detect a quantity of errors within the codeword and may determine whether to perform the second read operation based on the detected quantity of errors. By dynamically adjusting the reference voltage to output a codeword stored by the set of memory cells, the read operation may be associated with a higher reliability when compared to a read operation where the memory device uses a single reference voltage.

Features of the disclosure are initially described in the context of systems and dies as described with reference to FIGS. 1-2. Features of the disclosure are described in the context of voltage distribution plots, process flows, and circuits as described with reference to FIGS. 3-7. These and other features of the disclosure are further illustrated by and described with reference to an apparatus diagram and flowcharts that relate to method for setting a reference voltage for ferroelectric random access memory (FeRAM) read operations as described with reference to FIGS. 8–10.

FIG. 1 illustrates an example of a system 100 that supports method for setting a reference voltage for read operations in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a slave-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of host device may be in coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or a system on a chip (SoC), among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

The memory device 110 may include a device memory controller 155 and one or more memory dies 160 (e.g., memory chips) to support a desired capacity or a specified capacity for data storage. Each memory die 160 may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies may be referred to as a multi-die memory or a multi-die package or a multi-chip memory or a multi-chip package.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may be operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165, or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

In examples described herein, the memory device 110 may be configured to dynamically adjust a reference voltage used during a read operation. For example, the memory device 110 may perform a read operation on a set of memory cells within a memory array 170 to detect a codeword stored by the set of memory cells. The memory device 110 may identify a quantity of bits within the detected codeword that are a first logic value (e.g., a logic value '1') and compare the quantity of bits within the detected codeword to an expected quantity of bits within the codeword that are the first logic value. Based on comparing the quantity of bits within the detected codeword to the expected quantity of bits within the codeword that are the first logic value, the memory device 110 may determine whether to adjust the reference voltage and perform a second read operation on the set of memory cells. In some cases, the memory device 110 may additionally perform an error control operation to detect a quantity of errors within the codeword and may determine whether to perform the second read operation based on the detected quantity of errors. By dynamically adjusting the reference voltage to output a codeword stored by the set of memory cells, the read operation may be associated with a higher reliability when compared to a read operation where the memory device uses a single reference voltage.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

Figure 2:
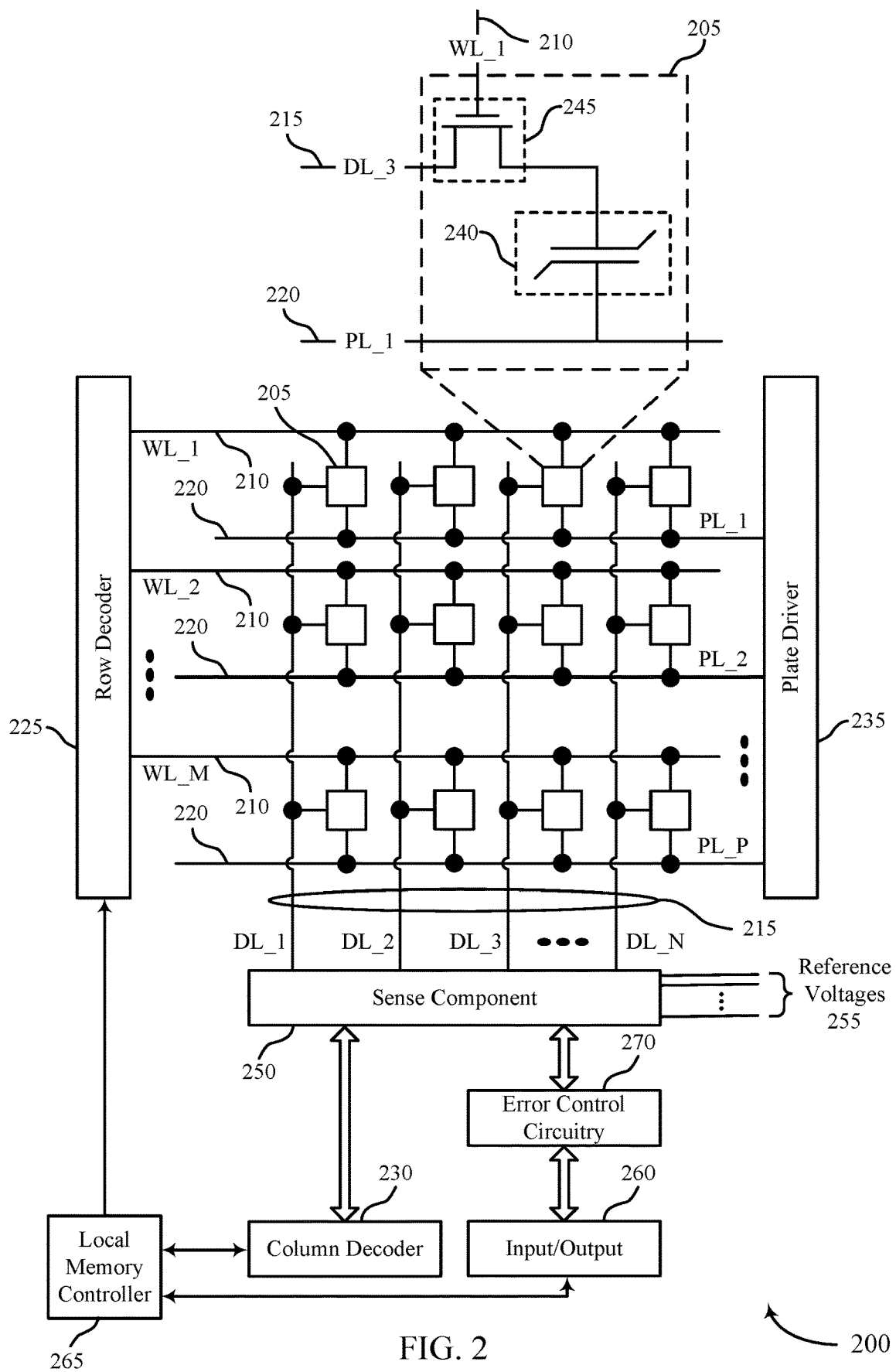
FIG. 2 illustrates an example of a memory die that supports method for setting a reference voltage for read operations in accordance with examples as disclosed herein.

FIG. 2 illustrates an example of a memory die 200 that supports method for setting a reference voltage for read operations in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a state (e.g., polarization state or dielectric charge) representative of the programmable states in a capacitor. In FeRAM architectures, the memory cell 205 may include a capacitor 240 that includes a ferroelectric material to store a charge and/or a polarization representative of the programmable state. The memory cell 205 may include a logic storage component, such as capacitor 240, and a switching component 245. The capacitor 240 may be an example of a ferroelectric capacitor. A first node of the capacitor 240 may be coupled with the switching component 245 and a second node of the capacitor 240 may be coupled with a plate line 220. The switching component 245 may be an example of a transistor or any other type of switch device that selectively establishes or de-establishes electronic communication between two components.

The memory die 200 may include access lines (e.g., the word lines 210, the digit lines 215, and the plate lines 220) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, bit lines, or plate lines, or their analogues, are interchangeable without loss of understanding or operation. Memory cells 205 may be positioned at intersections of the word lines 210, the digit lines 215, and/or the plate lines 220.

Operations such as reading and writing may be performed on memory cells 205 by activating or selecting access lines such as a word line 210, a digit line 215, and/or a plate line 220. By biasing a word line 210, a digit line 215, and a plate line 220 (e.g., applying a voltage to the word line 210, digit line 215, or plate line 220), a single memory cell 205 may be accessed at their intersection. Activating or selecting a word line 210, a digit line 215, or a plate line 220 may include applying a voltage to the respective line.

Accessing the memory cells 205 may be controlled through a row decoder 225, a column decoder 230, and a plate driver 235. For example, a row decoder 225 may receive a row address from the local memory controller 265 and activate a word line 210 based on the received row address. A column decoder 230 receives a column address from the local memory controller 265 and activates a digit line 215 based on the received column address. A plate driver 235 may receive a plate address from the local memory controller 265 and activates a plate line 220 based on the received plate address.

Selecting or deselecting the memory cell 205 may be accomplished by activating or deactivating the switching component 245. The capacitor 240 may be in electronic communication with the digit line 215 using the switching component 245. For example, the capacitor 240 may be isolated from digit line 215 when the switching component 245 is deactivated, and the capacitor 240 may be coupled with digit line 215 when the switching component 245 is activated.

The sense component 250 may determine a state (e.g., a polarization state or a charge) stored on the capacitor 240 of the memory cell 205 and determine a logic state of the memory cell 205 based on the detected state. The sense component 250 may include one or more sense amplifiers to amplify the signal output of the memory cell 205. The sense component 250 may compare the signal received from the memory cell 205 across the digit line 215 to one or more reference voltages 255 (e.g., a reference threshold). The detected logic state of the memory cell 205 may be provided as an output of the sense component 250 (e.g., to error control circuitry 270), and may indicate the detected logic state to another component of a memory device 110 that includes the memory die 200. In some cases, the sense component 250 may determine the state stored on the capacitors 240 of a set of memory cells 205. Here, the sense component 250 may output a codeword to the error control circuitry 270 (e.g., a set of logic states stored by the set of memory cells 205).

The error control circuitry 270 may perform an error control operation on the codeword received from the sense component 250. Examples of an error control operation may include an error detection operation, an error correction operation, or both. Thus, the error control circuitry 270 may output (e.g., to input/output 260) the codeword and a quantity of errors detected with the codeword.

The local memory controller 265 may control the operation of memory cells 205 through the various components (e.g., row decoder 225, column decoder 230, plate driver 235, and sense component 250). The local memory controller 265 may be an example of the local memory controller 165 described with reference to FIG. 1. In some examples, one or more of the row decoder 225, column decoder 230, and plate driver 235, and sense component 250 may be co-located with the local memory controller 265. The local memory controller 265 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 265 may generate row signals and column address signals to activate the target word line 210, the target digit line 215, and the target plate line 220. The local memory controller 265 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 265 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 265 in response to various access commands (e.g., from a host device 105). The local memory controller 265 may be operable to perform other access operations not listed here or other operations related to the operating of the memory die 200 that are not directly related to accessing the memory cells 205.

The local memory controller 265 may be operable to perform a read operation (e.g., a sense operation) on one or more memory cells 205 of the memory die 200. During a read operation, the logic state stored in a memory cell 205 of the memory die 200 may be determined. The local memory controller 265 may identify a target memory cell 205 on which to perform the read operation. The local memory controller 265 may identify a target word line 210, a target digit line 215, and target plate line 220 coupled with the target memory cell 205. The local memory controller 265 may activate the target word line 210, the target digit line 215, and the target plate line 220 (e.g., applying a voltage to the word line 210, digit line 215, or plate line 220) to access the target memory cell 205. The target memory cell 205 may transfer a signal to the sense component 250 in response to biasing the access lines. The sense component 250 may amplify the signal. The local memory controller 265 may activate the sense component 250 (e.g., latch the sense component) and thereby compare the signal received from the memory cell 205 to one or more of the reference voltages 255. Based on that comparison, the sense component 250 may determine a logic state that is stored on the memory cell 205.

In some cases, the sense component 250 may be configured to compare a signal output from a target memory cell 205 to more than one reference voltage 255. For example, the local memory controller 265 may perform a first read operation on a set of memory cells 205 of the memory die 200. Based on the signals output by the set of memory cells 205, the sense component 250 may amplify the signal and compare the signal to a first reference voltage 255 and output a detected codeword. The local memory controller 265 may receive the detected codeword (e.g., via the error control circuitry 270 and the input/output 260) from the sense component 250. The local memory controller 265 may additionally receive an expected quantity of bits within the codeword having a first logic value (e.g., a logic value '1', a logic value '0'). For example, the value associated with the expected quantity of bits within the codeword having the first logic value may be stored by one or more memory cells 205 of the memory die 200. Here, the local memory controller 265 may receive the value associated with the expected quantity of bits from the sense component 250. In some other cases, the value associated with the expected quantity of bits within the codeword having the first logic value may be stored by one or more memory cells 205 on a different memory die 200 of the memory device. Here, the local memory controller 265 may receive the expected quantity of bits within the first codeword having the first logic value from another sense component 250 or another local memory controller 265 of the memory device.

The local memory controller 265 may identify a quantity of bits within the detected codeword received from the sense component 250 that are the first logic value compare the quantity of bits within the detected codeword to the expected quantity of bits within the codeword that are the first logic value. Based on comparing the quantity of bits within the detected codeword to the expected quantity of bits within the codeword that are the first logic value, the local memory controller 265 may determine whether to adjust the reference voltage 255 and perform a second read operation on the set of memory cells 205. For example, if the local memory controller 265 determines that the quantity of bits within the detected codeword having the first logic value is the same as the expected quantity of bits within the codeword having the first logic value, the local memory controller 265 may determine not to adjust the reference voltage 255 and perform a second read operation. Additionally, if the local memory controller 265 determines that the quantity of bits within the detected codeword having the first logic value is different from the expected quantity of bits within the codeword having the first logic value, the local memory controller 265 may determine to perform a second read operation with a different reference voltage 255 (e.g., a larger reference voltage, a smaller reference voltage).

In some cases, the local memory controller 265 may additionally receive a detected quantity of errors within the codeword (e.g., from the error control circuitry 270) and determine whether to perform the second read operation based on the detected quantity of errors. For example, if the error control circuitry 270 indicates that the detected quantity of errors within the codeword is zero, the local memory controller 265 may determine to not to adjust the reference voltage 255 and perform a second read operation. Additionally, if the error control circuitry 270 indicates that the detected quantity of errors within the codeword is greater than zero, the local memory controller may, in some cases, determine to perform a second read operation with a different reference voltage 255 (e.g., a larger reference voltage, a smaller reference voltage). By dynamically adjusting the reference voltage 255 to output a codeword stored by the set of memory cells 205, the read operation may be associated with a higher reliability when compared to a read operation where the memory device uses a single reference voltage 255.

Figure 3:
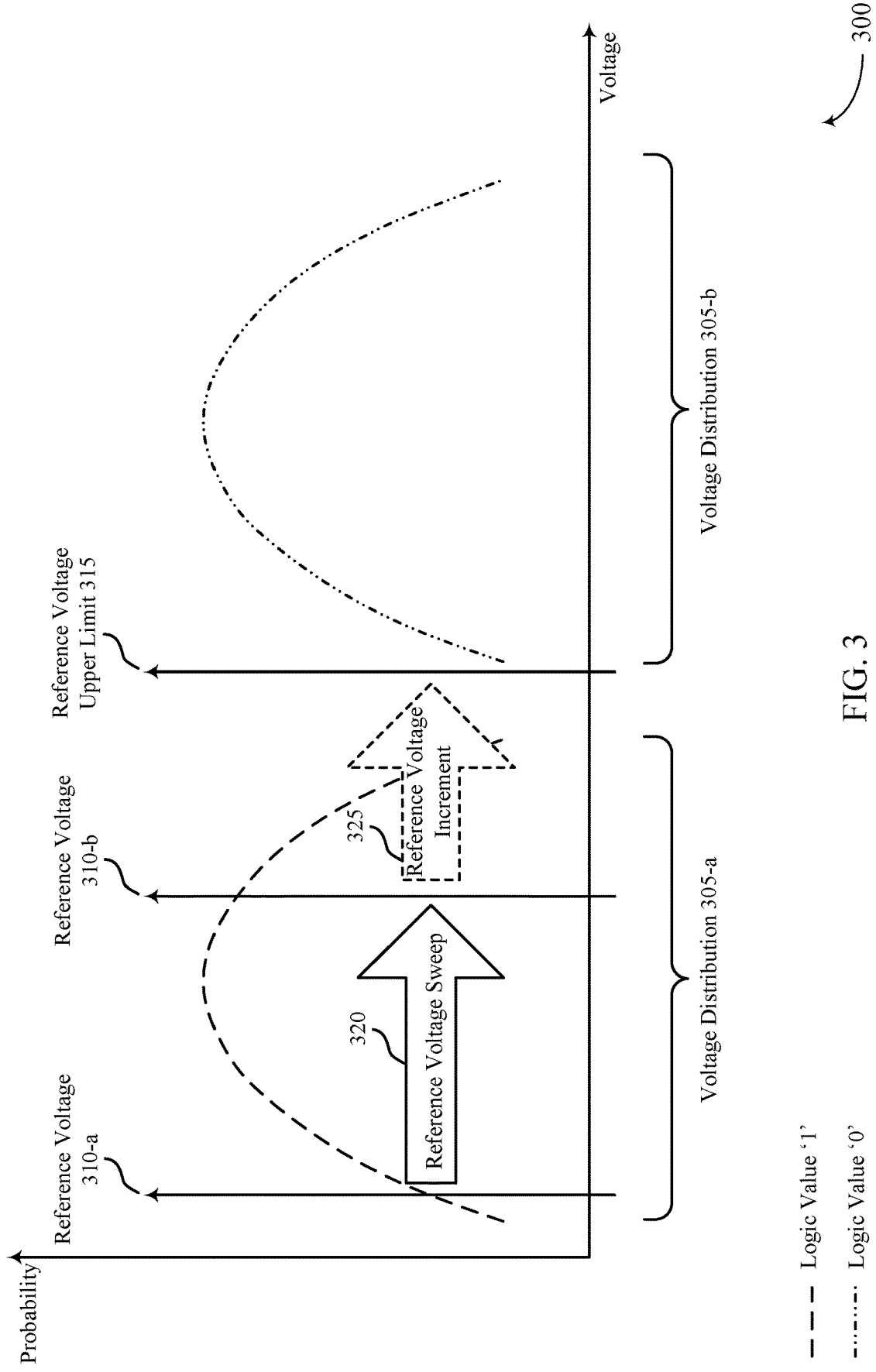
FIG. 3 illustrates an example of a voltage distribution plot that supports method for setting a reference voltage for read operations in accordance with examples as disclosed herein.

FIG. 3 illustrates an example of a voltage distribution plot 300 that supports method for setting a reference voltage for read operations in accordance with examples as disclosed herein. The voltage distribution plot 300 illustrates a voltage distribution 305-a associated with a signal output by a memory cell storing a logic value '1' and a voltage distribution 305-b associated with a signal output by a memory cell storing a logic value '0.' The voltage distribution plot 300 also illustrates an example set of reference voltages 310. In some cases, a memory device may perform one or more read operations on a set of memory cells, each using a different reference voltage 310.

During a read operation, a memory array may output a set of signals based on the logic values being stored by the set of accessed memory cells. A sense amplifier may receive the set of signals and output a codeword including a set of bits each associated with one of memory cells of the set of accessed memory cells. In the example of voltage distribution plot 300, the sense amplifier may output a bit having a logic value '1' if the signal is less than the reference voltage 310. Additionally, the sense amplifier may output a bit having with a logic value '0' if the signal has a voltage that is greater than the reference voltage 310. In other examples, the sense amplifier may instead output a bit having a logic value '1' if the signal is greater than the reference voltage 310 and output a bit having a logic value '0' if the signal is less than the reference voltage. In the example of voltage distribution plot 300, if a memory cell storing a logic value '1' outputs a signal with a voltage less than the reference voltage 310-b and a read operation is performed using the reference voltage 310-b, the sense amplifier may output a bit having a logic value '1.' Additionally, if a memory cell storing a logic value '0' outputs a signal with a voltage greater than the reference voltage 310-b and a read operation is performed using the reference voltage 310-b, the sense amplifier may output a bit having a logic value '0.'

Voltage distribution plot 300 may illustrate a method for a memory device to perform a read operation using more than one reference voltage 310. The memory device may perform a first read operation using a first reference voltage 310-a with a relatively low voltage. The sense amplifier may output the codeword detected based on performing the read operation using the first reference voltage 310-a to a controller (e.g., a local memory controller, a device memory controller). The controller may compare a quantity of bits within the detected codeword having a first logic value with an expected quantity of bits within the codeword having the first logic value (e.g., 'n' bits). In the example of voltage distribution plot 300, the controller may compare the quantity of bits within the detected codeword having a logic value '1' with an expected quantity of bits within the codeword having a logic value '1'. In some other examples, the controller may compare the quantity of bits within the detected codeword having a logic value '0' with an expected quantity of bits within the codeword having a logic value '0'. In some cases (e.g., in the case of a read operation performed using the reference voltage 310-a), the controller identify that the detected codeword has significantly less bits having a logic value '1' than expected (e.g., two less bits having a logic value '1', three less bits having a logic value '1'). Thus, the controller may determine to perform a second read operation using a reference voltage 310 greater than reference voltage 310-a.

The controller may continue to perform the reference voltage sweep 320 by performing read operations using different reference voltages 310 (e.g., incrementally larger than a previously-used reference voltage 310) until the controller receives a codeword with a quantity of bits having the first logic value that is within a threshold quantity of the expected quantity of bits within the codeword having the first logic value. For example, the controller may increment the reference voltage 310 used for performing read operations from reference voltage 310-a to a larger reference voltage 310 (e.g., reference voltage 310-b) until performing a read operation using the larger reference voltage 310 generates a codeword with a quantity of bits having a logic value '1' that is equal to, or greater than, one less than the expected quantity of bits having the logic value '1' (e.g., n−1). For example, the controller may perform a read operation on the set of memory cells using the reference voltage 310-b and detect a codeword with a quantity of bits having a logic value '1' equal to one less than the expected quantity of bits having the logic value '1' (e.g., n−1). Thus, the controller may end the reference voltage sweep 320 after performing the read operation using the reference voltage 310-b.

In some cases, the memory device may end the reference voltage sweep 320 based on other threshold quantities. For example, the memory device may end the reference voltage sweep 320 when the quantity of bits having the first logic value is within two or three bits of the expected quantity of bits within the codeword having the first logic value. Additionally, in some memory devices, the controller may perform a reference voltage sweep 320 from a relatively high voltage and incrementally decrease the reference voltage 310 until the quantity of bits having the first logic value is within the threshold quantity of bits of the expected quantity of bits within the codeword having the first logic value.

During the reference voltage sweep 320, the memory device may refrain from performing an error control operation on the detected codewords. For example, a sense component may output the detected codeword to a controller without performing an error control operation).

After the controller identifies that a detected codeword includes a quantity of bits having the first logic value that is within a threshold quantity of the expected quantity of bits within the codeword having the first logic value, the controller may select a reference voltage upper limit 315. For example, the controller may select the reference voltage upper limit 315 based on the reference voltage 310-b (e.g., used to generate the codeword that includes the quantity of bits having the first logic value that is within the threshold quantity of expected bits within the codeword having the first logic value). In some cases, the reference voltage upper limit 315 may be selected based on a defined voltage difference between the reference voltage 310-b and the reference voltage upper limit 315. In some other cases, the reference voltage upper limit 315 may be defined.

After performing the reference voltage sweep 320, the controller may begin a reference voltage increment 325. Here, the controller may increment the reference voltage 310 (e.g., a discrete amount) from the reference voltage 310-b and perform a read operation using the incremented reference voltages 310. During the reference voltage increment 325, the memory device may perform an error control operation associated with each read operation (e.g., using error control circuitry). For example, the controller may increment the reference voltage 310 from the reference voltage 310-b and perform a read operation using the incremented reference voltage. Prior to the controller comparing a quantity of bits of a first logic value within the detected codeword, error control circuitry may perform an error control operation on the detected codeword. Thus, the controller may receive (from the error control circuitry), the detected codeword and a quantity of errors detected within the codeword. Additionally, the error control circuitry may correct one or more errors within the detected codeword.

The controller may perform the reference voltage increment 325 until one of a set of conditions is met. For example, the controller may stop performing the reference voltage increment 325 (e.g., and determine to not perform an additional read operation) when a detected codeword includes a quantity of bits having the first logic value that is the same as the expected quantity of bits having the first logic value and a quantity of detected errors within the codeword is zero. In another example, the controller may stop performing the reference voltage increment 325 when the incremented reference voltage 310 is equal to the reference voltage upper limit 315. Additionally, the controller may stop performing the reference voltage increment 325 when the quantity of bits within the detected codeword having the first logic value is different from the expected quantity of bits within the codeword having the first logic value by a threshold quantity. For example, the controller may stop performing the reference voltage increment 325 when the quantity of bits having a logic value '1' is at least one more than the expected quantity of bits within the codeword having a logic value '1'.

In some cases, the controller may elect to perform a reference voltage decrement operation after performing a reference voltage sweep 320. For example, if the reference voltage sweep 320 starts at a relatively high reference voltage 310 (e.g., greater than the reference voltage upper limit 315) and sweeps to a lower reference voltage 310, the controller may perform a reference voltage decrement operation. Here, the controller may decrease the reference voltage 310 used for read operations until the one or more conditions are met. The conditions may include the reference voltage 310 reaching a reference voltage lower limit, the quantity of bits within a detected codeword having the first logic value different from the expected quantity of bits within the codeword having the first logic value by a threshold quantity, or when a detected codeword includes a quantity of bits having the first logic value that is the same as the expected quantity of bits having the first logic value and a quantity of detected errors within the codeword is zero.

When the controller elects to stop performing the reference voltage increment 325 (e.g., when the controller elects to not perform an additional read operation using a different reference voltage 310), the memory device may output the detected codeword (e.g., to a host device) associated with the last read operation. In some cases, the memory device may additionally perform an error control operation on the detected codeword and correct one or more errors within the codeword. Here, the memory device may output the codeword after performing the error control operation.

Figure 4:
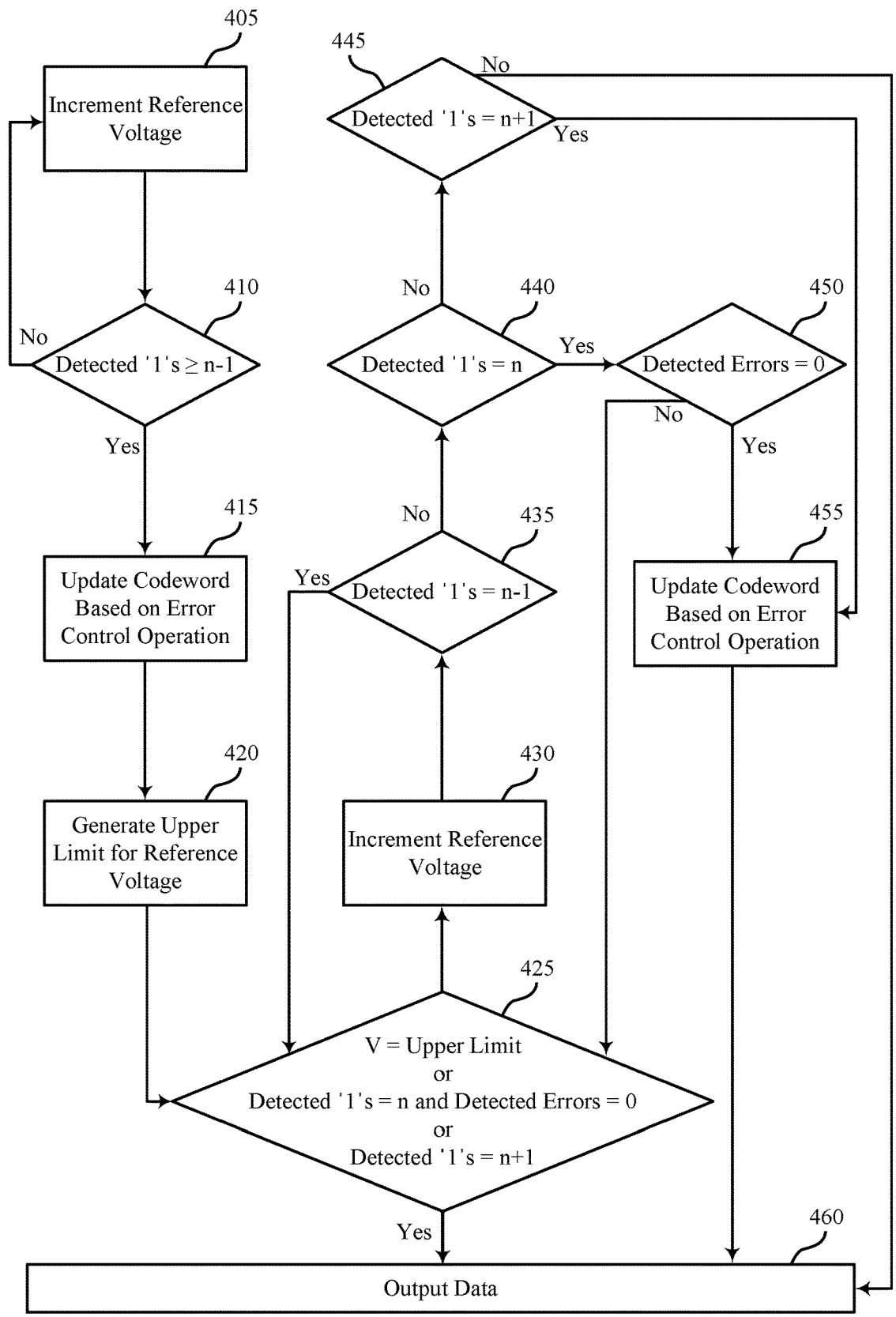
FIG. 4 illustrates an example of a process flow that supports method for setting a reference voltage for read operations in accordance with examples as disclosed herein.

FIG. 4 illustrates an example of a process flow 400 that supports method for setting a reference voltage for read operations in accordance with examples as disclosed herein. Process flow 400 may illustrate a method for a memory device to perform a read operation. In some cases, the process flow 400 may illustrate a method for a memory device performing a read operation associated with more than one reference voltage. For example, the process flow 400 may illustrate a read operation including a reference voltage sweep and reference voltage increment as described with reference to FIG. 3. Here, the reference voltage sweep may correspond to a reference voltage sweep from a relatively low reference voltage to a relatively high reference voltage. In some other examples, however, a memory device may utilize a reference voltage sweep from a relatively high voltage to a relatively low voltage and subsequently utilize a reference voltage decrement.

At 405, the memory device may increment a reference voltage for performing a read operation. For example, a controller of the memory device may increment the reference voltage (e.g., from a previously-used reference voltage) and perform a read operation on a set of memory cells using the incremented reference voltage. In some cases, the controller may increment the reference voltage by a configured voltage difference. The controller may receive a codeword detected based on performing the read operation using the reference voltage. In some cases, the controller may increment the reference voltage as part of a reference voltage sweep as described with reference to FIG. 3. After incrementing the reference voltage, the controller may proceed to 410.

At 410, the memory device (e.g., by the controller) may determine whether a detected quantity of bits having a logic value '1' is greater than or equal to 'n−1,' where 'n' corresponds to an expected quantity of bits within the codeword having a logic value '1'. In some cases, the controller may compare the detected codeword to an expected codeword to determine whether the detected quantity of bits having a logic value '1' is greater than or equal to 'n−1.' In some other cases, the controller may compare the quantity of '1's in the detected codeword to an expected quantity of '1's. In some other cases, the controller may determine whether the detected quantity of bits in codeword having a logic value '1' is within a different quantity of 'n'. For example, the controller may determine whether the detected quantity of bits in the codeword having a logic value '1' is two or three less than 'n'. Additionally, in some other examples the controller may compare the detected quantity of bits having a different logic value (e.g., other than the logic value '1') to 'n−1', where 'n' corresponds to the expected quantity of bits within the codeword having that different logic value (e.g., a logic value of 'L', 'M', 'H', '0').

In the example of process flow 400, if the controller determines that the detected quantity of bits having the logic value '1' is greater than or equal to 'n−1', the memory device may proceed to 415. That is, the controller may end the reference voltage sweep on the set of memory cells. Alternatively, if the controller determines that the detected quantity of bits having the logic value '1' is lower than 'n−1', the memory device may instead proceed to 405. That is, the controller may continue performing the reference voltage sweep on the set of memory cells.

At 415, the memory device may perform an error control operation on the detected codeword. For example, error control circuitry may receive the detected codeword and detect a quantity of errors within the detected codeword. Additionally or alternatively, the error control circuitry may correct one or more errors within the detected codeword. That is, the codeword may be updated based on the error control circuitry correcting one or more errors within the codeword. After performing the error control operation, the memory device may proceed to 420.

At 420, the memory device controller may generate an upper limit for the reference voltage. For example, the controller may determine the upper limit based on the last reference voltage used to detect the codeword at 405. After generating the upper limit for the reference voltage, the memory device may proceed to 425. In some cases, proceeding to 425 may correspond to the memory device beginning the reference voltage increment as described with reference to FIG. 3.

At 425, the memory device may determine if one or more conditions are met. For example, the controller may determine if the reference voltage (e.g., 'V') used most recently to detect the codeword stored by the set of memory cells is equal to the upper limit for the reference voltage (e.g., generated at 420). Additionally, the controller may determine if the quantity of '1's in the detected codeword equals 'n' (e.g., an expected quantity of '1's in the codeword) and the quantity of detected errors in the codeword equals 0. The controller may additionally determine if the detected quantity of '1's in the codeword is equal to or greater than 'n+1' (e.g., one more than the expected quantity of '1's). The controller may determine whether the detected quantity of '1's is equal to or greater than the expected quantity of '1's by comparing the detected codeword to a codeword expected to be stored by the set of memory cells. Additionally or alternatively, the controller may identify 'n' and compare the detected quantity of '1's within the codeword to 'n'.

In some cases, if any of the conditions are met, the memory device may determine to not perform another read operation (e.g., to not increment a reference voltage and perform the read operation using the incremented reference voltage). For example, if the controller identifies that one or more of the conditions are met, the memory device may proceed to 460. Alternatively, if none of the conditions are met, the memory device may determine to perform another read operation (e.g., to continue to increment the reference voltage as described with reference to FIG. 3). Here, the memory device may proceed to 430.

At 430, the memory device may increment the reference voltage for performing the read operation perform another read operation on the set of memory cells using the incremented reference voltage. Here, the controller may receive another codeword detected based on performing the read operation using the reference voltage. In some cases, the controller may increment the reference voltage as part of the reference voltage increment as described with reference to FIG. 3. In some cases, the memory device may additionally perform an error control operation on the detected codeword. For example, error control circuitry may perform an error detection operation to detect a quantity of errors within the codeword. After incrementing the reference voltage, the memory device may proceed to 435.

At 435, the memory device (e.g., the controller of the memory device) may determine whether the quantity of '1's within the codeword detected using the reference voltage generated at 430 equals 'n−1' (e.g., one less than an expected quantity of '1's within the codeword). If the controller determines that the quantity of '1's within the codeword equals 'n−1', the memory device may proceed back to 425. Additionally, if the controller determines that the quantity of '1's within the codeword does not equal 'n−1', the memory device may proceed to 440.

At 440, the controller may determine whether the quantity of '1's within the codeword detected using the reference voltage generated at 430 equals 'n' (e.g., the expected quantity of '1's within the codeword). If the controller determines that the quantity of '1's within the codeword equals 'n', the memory device may proceed to 450. Additionally, if the controller determines that the quantity of '1's within the codeword does not equal 'n', the memory device may proceed to 445.

At 445, the controller may determine whether the quantity of '1's within the codeword detected using the reference voltage generated at 430 equals 'n+1' (e.g., one more than an expected quantity of 1's within the codeword). If the controller determines that the quantity of '1's within the codeword equals 'n+1', the memory device may proceed to 455. Additionally, if the controller determines that the quantity of '1's within the codeword does not equal 'n+1', the memory device may proceed to 460.

At 450, the memory device may determine whether a quantity of errors detected in the codeword is 0. For example, the controller may receive the quantity of detected errors in the codeword from error control circuitry and determine whether the quantity of detected errors within the codeword equals 0. If the quantity of detected errors in the codeword is 0, the memory device may proceed to 455. Additionally, if the quantity of detected errors in the codeword does not equal 0, the memory device may proceed to 425.

At 455, the memory device may update the codeword based on an error control operation. That is, the error control circuitry may perform an error correction operation on the codeword and correct one or more errors to generate the updated codeword. The memory device may then proceed to 460.

At 460, the memory device may output the codeword to the host device. For example, the memory device may perform the read operation based on receiving a command from the host device. Outputting the codeword to the host device may correspond to a completion of an execution of the read operation.

Figure 5:
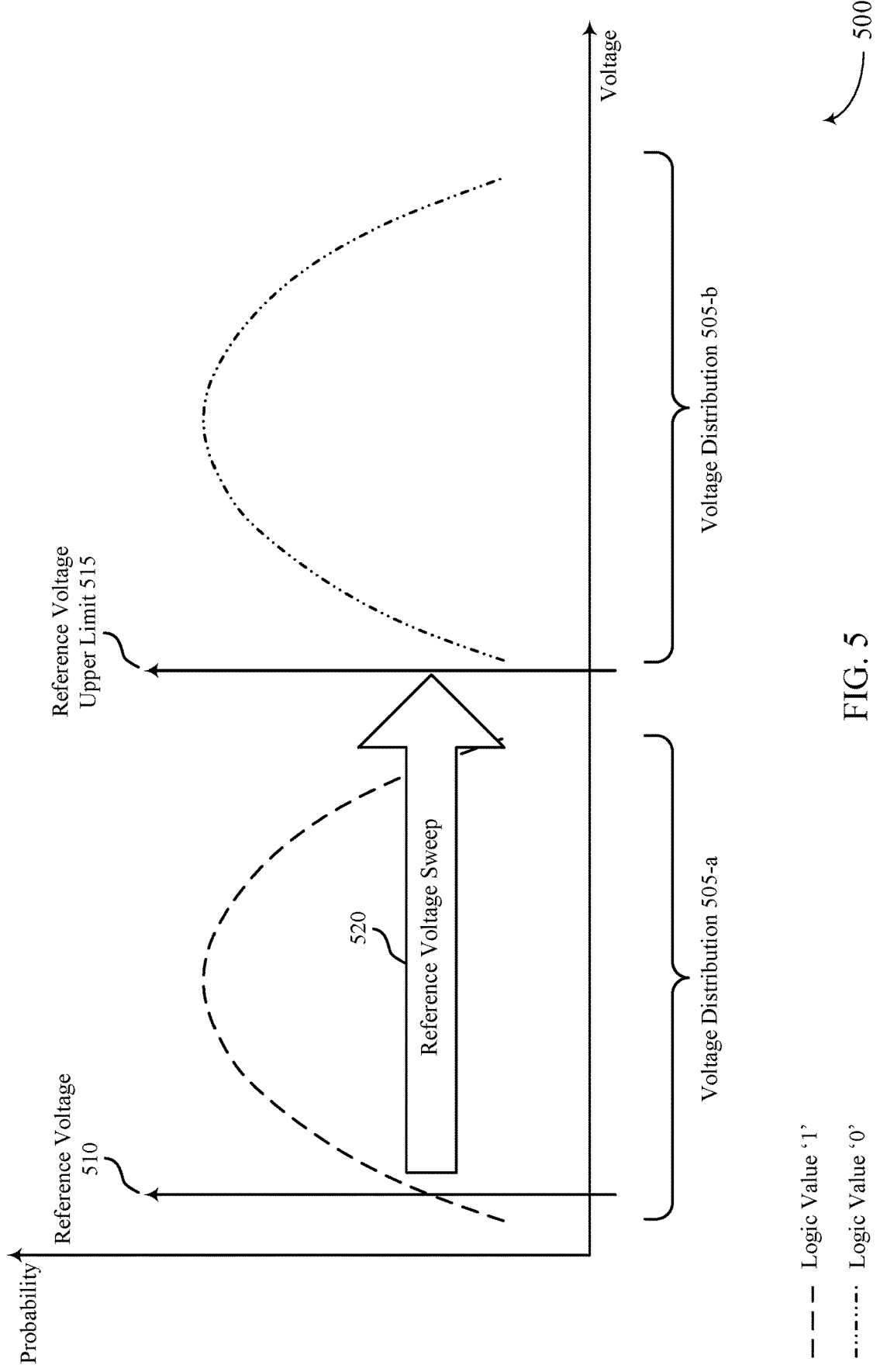
FIG. 5 illustrates an example of a voltage distribution plot that supports method for setting a reference voltage for read operations in accordance with examples as disclosed herein.

FIG. 5 illustrates an example of a voltage distribution plot 500 that supports method for setting a reference voltage for read operations in accordance with examples as disclosed herein. The voltage distribution plot 500 illustrates a voltage distribution 505-*a* associated with a signal output by a memory cell storing a logic value '1' and a voltage distribution 505-*b* associated with a signal output by a memory cell storing a logic value '0.' The voltage distribution plot 500 also illustrates an example set of reference voltages 510. In some cases, a memory device may perform one or more read operations on a set of memory cells, each using a different reference voltage 510.

During a read operation, a memory array may output a set of signals based on the logic values being stored by the set of accessed memory cells. A sense amplifier may receive the set of signals and output a codeword including a set of bits each associated with one of memory cells of the set of accessed memory cells. In the example of voltage distribution plot 500, the sense amplifier may output a bit having a logic value '1' if the signal is less than a reference voltage 510. Additionally, the sense amplifier may output a bit having with a logic value '0' if the signal has a voltage that is greater than the reference voltage 510. In other examples, the sense amplifier may instead output a bit having a logic value '1' if the signal is greater than the reference voltage 510 and output a bit having a logic value '0' if the signal is less than the reference voltage. In the example of voltage distribution plot 500, if a memory cell storing a logic value '1' outputs a signal with a voltage less than the reference voltage 510-*b* and a read operation is performed using the reference voltage 510, the sense amplifier may output a bit having a logic value '1.' Additionally, if a memory cell storing a logic value '0' outputs a signal with a voltage greater than the reference voltage 510 and a read operation is performed using the reference voltage 510, the sense amplifier may output a bit having a logic value '0.'

Voltage distribution plot 500 may illustrate a method for a memory device to perform a read operation using more than one reference voltage 510. The memory device may perform a first read operation using a first reference voltage 510 with a relatively low voltage. The sense amplifier may output the codeword detected based on performing the read operation using the first reference voltage 510 to a controller (e.g., a local memory controller, a device memory controller). The sense amplifier may output the codeword to error control circuitry, which may perform an error control operation on the codeword. That is, the error control circuitry may correct one or more errors within the codeword. The error control circuitry may output the codeword to the controller. Additionally, the controller may receive the codeword directly from the sense amplifier (e.g., and the error control circuitry may not perform an error correction operation on the codeword).

The controller may compare a quantity of bits within the detected codeword having a first logic value with an expected quantity of bits within the codeword having the first logic value (e.g., 'n' bits). In the example of voltage distribution plot 500, the controller may compare the quantity of bits within the detected codeword having a logic value '1' with an expected quantity of bits within the codeword having a logic value '1'. In some other examples, the controller may compare the quantity of bits within the detected codeword having a logic value '0' with an expected quantity of bits within the codeword having a logic value '0'. In some cases (e.g., in the case of a read operation performed using the reference voltage 510), the controller may identify that the detected codeword has significantly less bits having a logic value '1' than expected (e.g., two less bits having a logic value '1', three less bits having a logic value '1'). Thus, the controller may determine to perform a second read operation using a reference voltage 510 greater than reference voltage 510.

The controller may continue to perform the reference voltage sweep 520 by performing read operations using different reference voltages 510 (e.g., incrementally larger than a previously-used reference voltage 510) until the controller receives a codeword with a quantity of bits having the first logic value that is equal to the expected quantity of bits within the codeword having the first logic value. For example, the controller may increment the reference voltage 510 used for performing read operations from reference voltage 510 to a larger reference voltage 510 until performing a read operation using the larger reference voltage 510 generates a codeword with a quantity of bits having a logic value '1' that is equal to the expected quantity of bits having the logic value '1' (e.g., n). For example, the controller may perform a read operation on the set of memory cells using the reference voltage 510 and detect a codeword with a quantity of bits having a logic value '1' equal the expected quantity of bits having the logic value '1' (e.g., n). Thus, the controller may end the reference voltage sweep 520 after performing the read operation using the reference voltage 510.

Additionally, the memory device may end the reference voltage sweep 520 when the controller performs a read operation using a reference voltage 510 equal to the reference voltage upper limit 515. In some cases, the reference voltage upper limit 515 may be defined (e.g., configured during a manufacturing or testing phase of the memory device). Additionally, the reference voltage upper limit 515 may be dynamically set (e.g., different based on a type of memory cell, a previously-used reference voltage).

When the controller elects to stop performing the reference voltage sweep 520 (e.g., when the controller elects to not perform an additional read operation using a different reference voltage 510), the memory device may output the detected codeword (e.g., to a host device) associated with the last read operation. In some cases, the memory device may additionally perform an error control operation on the detected codeword and correct one or more errors within the codeword. Here, the memory device may output the codeword after performing the error control operation.

Figure 6:
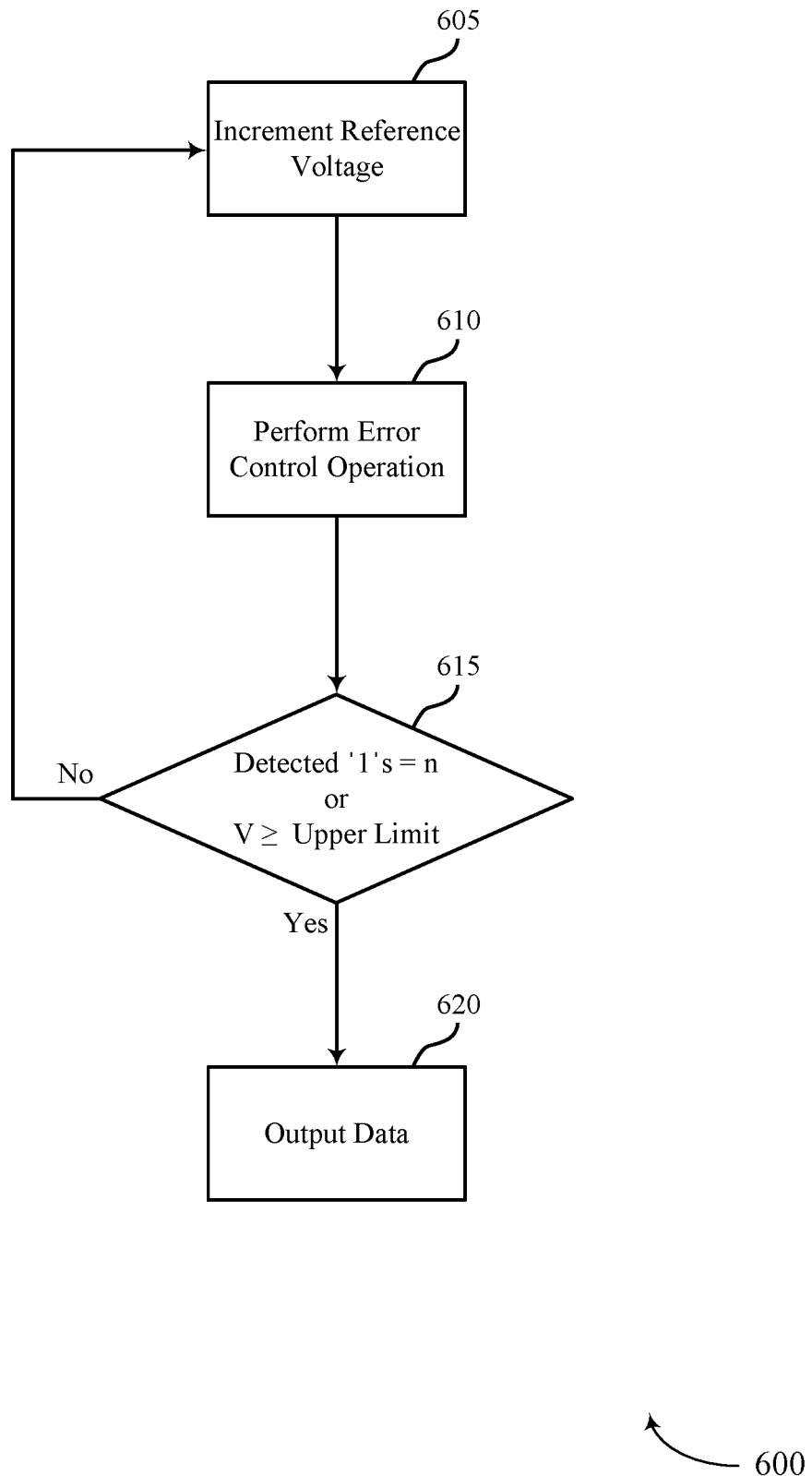
FIG. 6 illustrates an example of a process flow that supports method for setting a reference voltage for read operations in accordance with examples as disclosed herein.

FIG. 6 illustrates an example of a process flow 600 that supports method for setting a reference voltage for read operations in accordance with examples as disclosed herein. Process flow 600 may illustrate a method for a memory device to perform a read operation. In some cases, the process flow 600 may illustrate a method for a memory device performing a read operation associated with more than one reference voltage. For example, the process flow 600 may illustrate a read operation including a reference voltage sweep as described with reference to FIG. 5. Here, the reference voltage sweep may correspond to a reference voltage sweep from a relatively low reference voltage to a relatively high reference voltage. In some other examples, however, a memory device may utilize a reference voltage sweep from a relatively high voltage to a relatively low voltage.

At 605, the memory device may increment a reference voltage for performing a read operation. For example, a controller of the memory device may increment the reference voltage (e.g., from a previously-used reference voltage) and perform a read operation on a set of memory cells using the incremented reference voltage. In some cases, the controller may increment the reference voltage by a configured voltage difference. The controller may receive a codeword detected based on performing the read operation using the reference voltage. In some cases, the controller may increment the reference voltage as part of a reference voltage sweep as described with reference to FIG. 5. After incrementing the reference voltage, the controller may proceed to 610.

At 610, the memory device may perform an error control operation 610. For example, error control circuitry of the memory device may perform an error control operation 610 to detect one or more errors within the codeword. In some cases, the error control operation 610 may correct one or more detected errors in the codeword. After performing the error control operation, the memory device may proceed to 615.

At 615, the memory device may determine if one or more conditions are met. For example, the memory device may determine if the reference voltage (e.g., 'V') used most recently to detect the codeword stored by the set of memory cells is equal to the upper limit for the reference voltage. Additionally, the memory device may determine whether the quantity of '1's within the codeword detected using the reference voltage generated at 605 equals 'n' (e.g., the expected quantity of '1's within the codeword).

If the memory device determines that either of the conditions are met (e.g., if the reference voltage used equals the reference voltage upper limit or if the quantity of 1's within the codeword equals 'n'), the memory device may determine to stop the reference voltage sweep as described with reference to FIG. 5 and may not perform another read operation. Here, the memory device may proceed to 620. Additionally, if the controller determines that none of the conditions are met (e.g., if the reference voltage used is less than the reference voltage upper limit or if the quantity of '1's within the codeword equals is less than 'n'), the memory device may continue the reference voltage sweep and may perform another read operation. Here, the memory device may proceed to 605.

At 620, the memory device may output the codeword to the host device. For example, the memory device may perform the read operation based on receiving a command from the host device. Outputting the codeword to the host device may correspond to a completion of an execution of the read operation.

Figure 7:
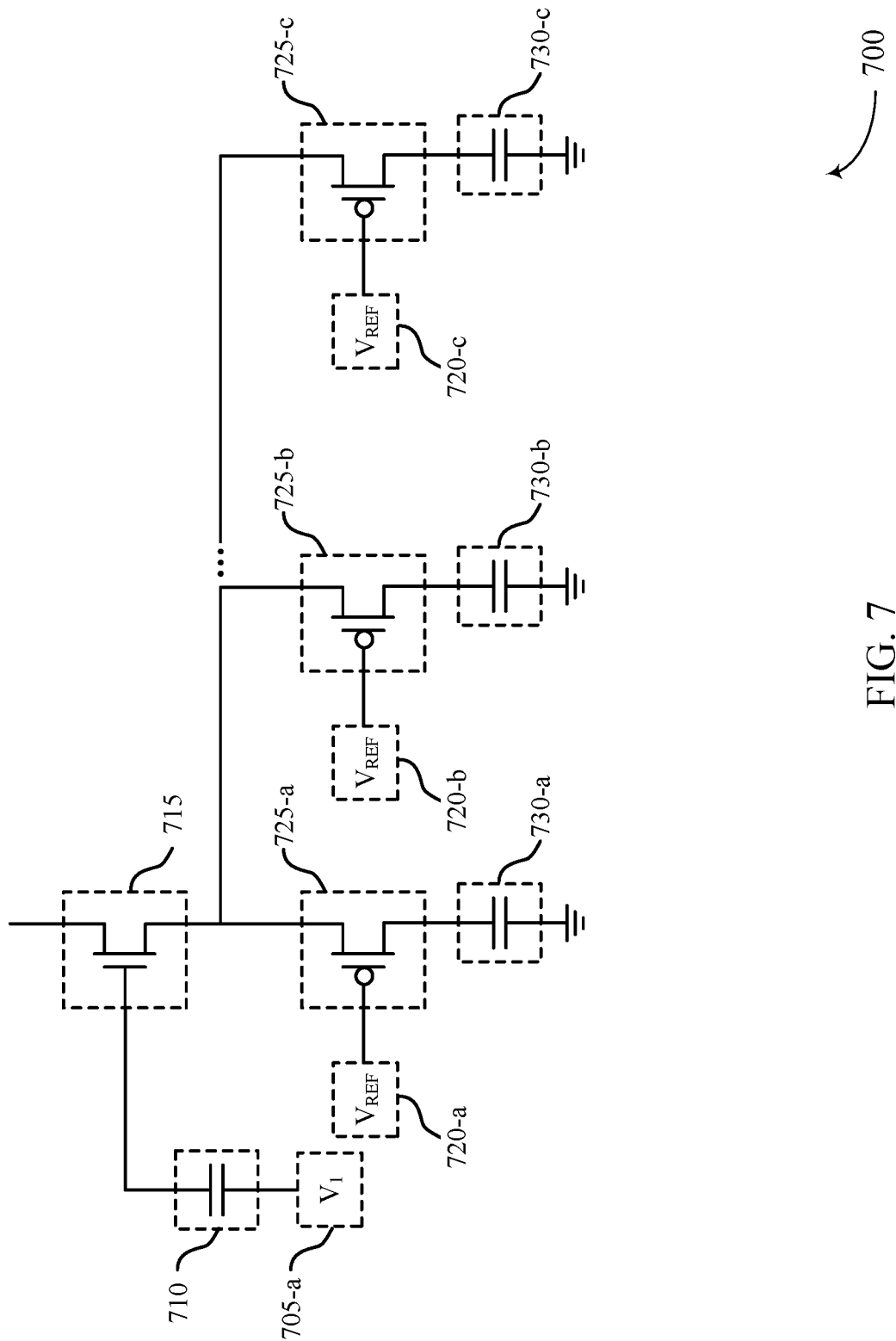
FIG. 7 illustrates an example of a circuit that supports method for setting a reference voltage for read operations in accordance with examples as disclosed herein.

FIG. 7 illustrates an example of a circuit 700 that supports method for setting a reference voltage for read operations in accordance with examples as disclosed herein. In some cases, the circuit 700 may illustrate aspects of a sense component and sense amplifier as described herein. The circuit 700 may include an amplifier capacitor 710 (AMP-CAP), a first transistor 715, reference voltages 720, and a plurality of second transistors 725. In some cases, the second transistors may be examples of amplifiers.

The AMPCAP 710 may be selectively coupled with a voltage source 705-*a* having a voltage $V_1$. The AMPCAP 710 may store a charge of the memory cell and may output a signal (e.g., a charge signal, a voltage signal, or both) to the transistor 715 that is based on the charge extracted from a memory cell during an access operation. The transistor 715 may output the signal to each of the plurality of second transistors 725 during the read operation. Circuit 700 illustrates an example where the circuit includes three of the second transistors 725, but in some cases, a memory device may include a circuit 700 including more or less of the plurality of second transistors 725. Each transistor 725 may have a reference voltage 720 (e.g., a reference voltage) coupled with the gate of the transistor 725. In a case that the signal (e.g., output by the AMPCAP 710) is greater than the reference voltage 720 applied to the gate of the transistor 725, the transistor 725 may turn on (e.g., enable a flow of charge through the transistor 725) and output an amplified signal to a capacitor 730.

The combination of the signal applied to the gate of the first transistor 715 by the AMPCAP 710 and the reference voltages 720 applied to the gate of the transistors 725 may be used to concurrently compare the signal from the memory cell to different reference voltages. For example, the transistor 725 may not turn on and may not enable a flow of charge through the transistor 725 based on the value applied to the gate of the first transistor 715 and the value applied to the gate of a given second transistor 725. In some cases, the capacitor 730 may remain uncharged (e.g., storing a voltage equal to or approximately equal to a ground voltage of the circuit 700). In some cases, the capacitors 730 may each be configured to store a codeword (or a bit of a codeword) detected using the reference voltage 720.

In some cases, each of the reference voltages 720 applied to the gates of the plurality of second transistors 725 may be different. For example, a first reference voltage 720-*a* may be equal to 1.3V, a second reference voltage 720-*b* may be equal to 1.5V, and a third reference voltage 720-*c* may be equal to 1.7V. Applying the different reference voltages 720 to the gates of each transistor 725 may result in a subset of the transistors turning on and a subset of the amplifiers not turning on. For example, if the signal output by the AMP-CAP 710 is $1.4V+2V_T$ (e.g., a threshold voltage associated with the transistor 725-*a*), the transistor 725-*a* may turn on (e.g., resulting in an amplified signal being stored by the capacitor 730-*a*) while the remaining transistors 725-*b* and 725-*c* may remain off.

In some cases, one of the second transistors 725 may be used to generate the codewords during a reference voltage sweep. For example, different reference voltages 720-*a* may be applied to the gate of the second transistors 725-*a* to perform the multiple read operations with different reference voltages 720-*a* during the reference voltage sweep. In some other cases, different second transistors 725 may be used to generate the codewords during the reference voltage sweep operation. Additionally, different second transistors 725 may be used to perform different read operations during a reference voltage increment. For example, a first reference voltage 720-*b* may be applied to the gate of the second transistor 725-*b* to perform a first read operation during the reference voltage increment and a second reference voltage 720-*c* may be applied to the gate of the third transistor 725-*c* to perform a second read operation during the reference voltage increment.

In some cases, the transistors 725 may receive the signal from the AMPCAP 710 at approximately a same time, and turn on or remain off based on a difference between the signal and the reference voltage 720 at approximately the same time. Thus, the circuit 700 may output each codewords (or bits of the codewords) to the capacitors 730 in parallel.

Figure 8:
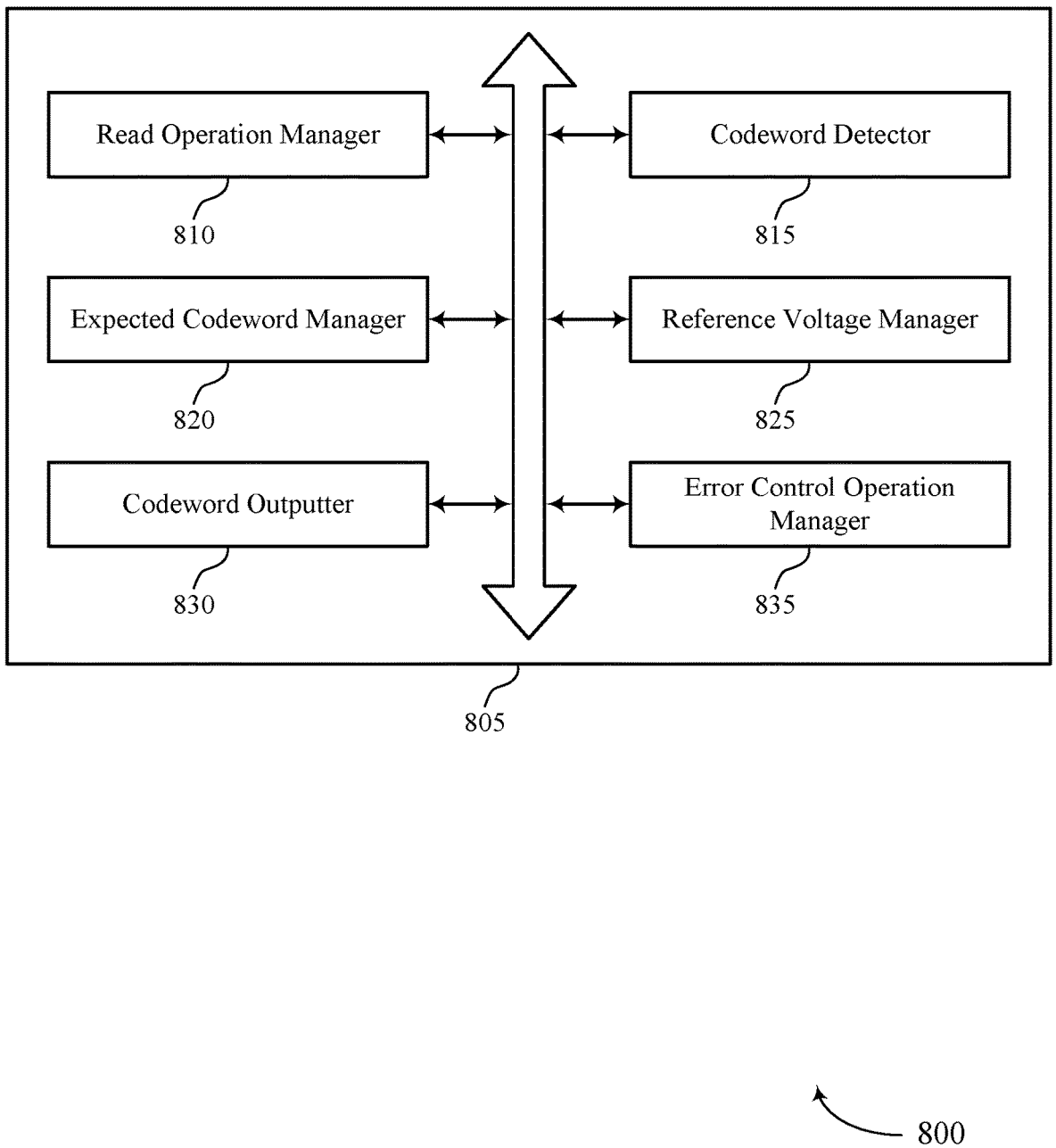
FIG. 8 shows a block diagram of a memory device that supports method for setting a reference voltage for read operations in accordance with examples as disclosed herein.

FIG. 8 shows a block diagram 800 of a memory device 805 that supports method for setting a reference voltage for read operations in accordance with examples as disclosed herein. The memory device 805 may be an example of aspects of a memory device as described with reference to FIGS. 1 through 7. The memory device 805 may include a read operation manager 810, a codeword detector 815, an expected codeword manager 820, a reference voltage manager 825, a codeword outputter 830, and an error control operation manager 835. Each of these components may communicate, directly or indirectly, with one another (e.g., via one or more buses).

The read operation manager 810 may perform, using a first reference voltage, a first read operation on a set of memory cells. In some examples, the read operation manager 810 may perform, using the second reference voltage, the second read operation on the set of memory cells based on determining to perform the second read operation. In some cases, the read operation manager 810 may perform, using the second reference voltage, the second read operation on the set of memory cells based on detecting one or more errors within the first codeword. In some instances, the read operation manager 810 may perform, using the second reference voltage, the second read operation on the set of memory cells based on determining that the first reference voltage is less than the upper limit of the reference voltage. In some other instances, the read operation manager 810 may perform, using the second reference voltage, the second read operation on the set of memory cells based on determining that the first reference voltage is greater than the lower limit of the reference voltage.

The codeword detector 815 may detect a first codeword based on performing the first read operation using the first reference voltage.

The expected codeword manager 820 may compare a first quantity of bits of the first codeword with a second quantity of bits of a second codeword, each bit of the first quantity of bits and the second quantity of bits having a first logic value, the second codeword expected to be stored in the set of memory cells. In some examples, the expected codeword manager 820 may identify that the first quantity of bits having the first logic value is less than the second quantity of bits having the first logic value based on the comparing, where performing the second read operation is based on identifying that the first quantity of bits is less than the second quantity of bits. In some cases, the expected codeword manager 820 may identify that the first quantity of bits having the first logic value is the same as the second quantity of bits having the first logic value based on the comparing, where outputting the first codeword is based on identifying that the first quantity of bits is the same as the second quantity of bits. In some instances, the expected codeword manager 820 may identify that the first quantity of bits having the first logic value is greater than the second quantity of bits having the first logic value based on the comparing, where outputting the first codeword is based on identifying that the first quantity of bits is greater than the second quantity of bits.

In some examples, the expected codeword manager 820 may identify that the first quantity of bits having the first logic value is greater than the second quantity of bits having the first logic value based on the comparing, where performing the second read operation is based on identifying that the first quantity of bits is greater than the second quantity of bits. In some cases, the expected codeword manager 820 may identify that the first quantity of bits having the first logic value is less than the second quantity of bits having the first logic value based on the comparing, where outputting the first codeword is based on identifying that the first quantity of bits is less than the second quantity of bits.

The reference voltage manager 825 may determine whether to perform a second read operation on the set of memory cells using a second reference voltage greater than the first reference voltage based on the comparing. In some examples, the reference voltage manager 825 may determine whether the first reference voltage is equal to an upper limit of a reference voltage, where determining whether to perform the second read operation is based on whether the first reference voltage is equal to the upper limit of the reference voltage.

In some examples, the reference voltage manager 825 may determine whether to perform a second read operation on the set of memory cells using a second reference voltage less than the first reference voltage based on the comparing. In some cases, the reference voltage manager 825 may determine whether the first reference voltage is equal to a lower limit of a reference voltage, where determining whether to perform the second read operation is based on whether the first reference voltage is equal to the lower limit of the reference voltage.

The codeword outputter 830 may output the first codeword based on determining to not perform the second read operation on the set of memory cells. In some examples, the codeword outputter 830 may output the first codeword based on detecting that the first codeword is free of errors and determining to not perform the second read operation on the set of memory cells. In some cases, the codeword outputter 830 may output the second codeword based on determining that the first reference voltage is equal to the upper limit of the reference voltage and determining to not perform the second read operation on the set of memory cells. In some other cases, the codeword outputter 830 may output the second codeword based on determining that the first reference voltage is equal to the lower limit of the reference voltage and determining to not perform the second read operation on the set of memory cells.

The error control operation manager 835 may perform an error control operation on the first codeword to detect a quantity of errors in the first codeword, where determining whether to perform the second read operation is based on the quantity of errors detected in the first codeword.

Figure 9:
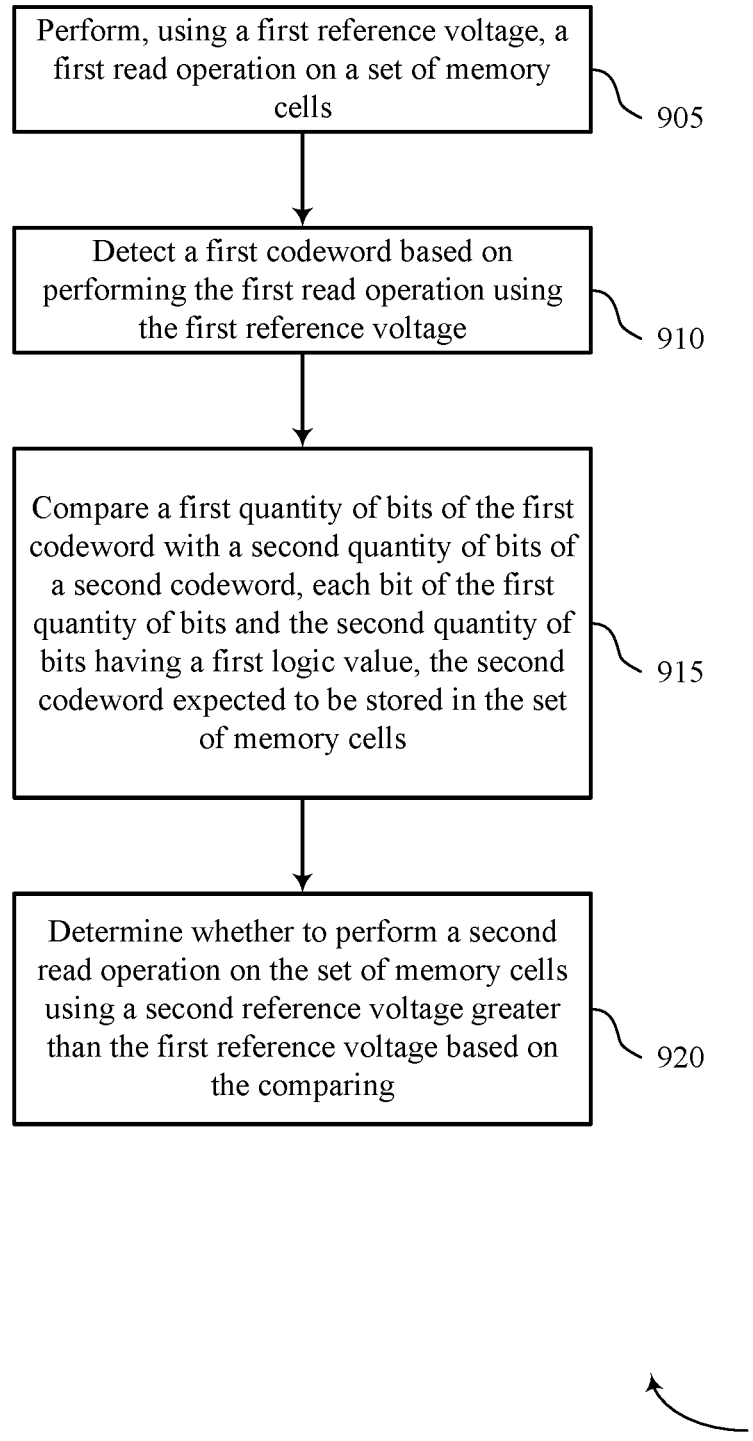
FIGS. 9 and 10 show flowcharts illustrating a method or methods that support method for setting a reference voltage for read operations in accordance with examples as disclosed herein.

FIG. 9 shows a flowchart illustrating a method or methods 900 that supports method for setting a reference voltage for read operations in accordance with examples as disclosed herein. The operations of method 900 may be implemented by a memory device or its components as described herein. For example, the operations of method 900 may be performed by a memory device as described with reference to FIG. 8. In some examples, a memory device may execute a set of instructions to control the functional elements of the memory device to perform the described functions. Additionally or alternatively, a memory device may perform aspects of the described functions using special-purpose hardware.

At 905, the memory device may perform, using a first reference voltage, a first read operation on a set of memory cells. The operations of 905 may be performed according to the methods described herein. In some examples, aspects of the operations of 905 may be performed by a read operation manager as described with reference to FIG. 8.

At 910, the memory device may detect a first codeword based on performing the first read operation using the first reference voltage. The operations of 910 may be performed according to the methods described herein. In some examples, aspects of the operations of 910 may be performed by a codeword detector as described with reference to FIG. 8.

At 915, the memory device may compare a first quantity of bits of the first codeword with a second quantity of bits of a second codeword, each bit of the first quantity of bits and the second quantity of bits having a first logic value, the second codeword expected to be stored in the set of memory cells. The operations of 915 may be performed according to the methods described herein. In some examples, aspects of the operations of 915 may be performed by an expected codeword manager as described with reference to FIG. 8.

At 920, the memory device may determine whether to perform a second read operation on the set of memory cells using a second reference voltage greater than the first reference voltage based on the comparing. The operations of 920 may be performed according to the methods described herein. In some examples, aspects of the operations of 920 may be performed by a reference voltage manager as described with reference to FIG. 8.

In some examples, an apparatus as described herein may perform a method or methods, such as the method 900. The apparatus may include features, means, or instructions (e.g., a non-transitory computer-readable medium storing instructions executable by a processor) for performing, using a first reference voltage, a first read operation on a set of memory cells, detecting a first codeword based on performing the first read operation using the first reference voltage, comparing a first quantity of bits of the first codeword with a second quantity of bits of a second codeword, each bit of the first quantity of bits and the second quantity of bits having a first logic value, the second codeword expected to be stored in the set of memory cells, and determining whether to perform a second read operation on the set of memory cells using a second reference voltage greater than the first reference voltage based on the comparing.

Some examples of the method 900 and the apparatus described herein may further include operations, features, means, or instructions for performing, using the second reference voltage, the second read operation on the set of memory cells based on determining to perform the second read operation.

Some cases of the method 900 and the apparatus described herein may further include operations, features, means, or instructions for identifying that the first quantity of bits having the first logic value may be less than the second quantity of bits having the first logic value based on the comparing, where performing the second read operation may be based on identifying that the first quantity of bits may be less than the second quantity of bits.

Some instances of the method 900 and the apparatus described herein may further include operations, features, means, or instructions for outputting the first codeword based on determining to not perform the second read operation on the set of memory cells.

Some examples of the method 900 and the apparatus described herein may further include operations, features, means, or instructions for identifying that the first quantity of bits having the first logic value may be the same as the second quantity of bits having the first logic value based on the comparing, where outputting the first codeword may be based on identifying that the first quantity of bits may be the same as the second quantity of bits.

Some cases of the method 900 and the apparatus described herein may further include operations, features, means, or instructions for identifying that the first quantity of bits having the first logic value may be greater than the second quantity of bits having the first logic value based on the comparing, where outputting the first codeword may be based on identifying that the first quantity of bits may be greater than the second quantity of bits.

Some instances of the method 900 and the apparatus described herein may further include operations, features, means, or instructions for performing an error control operation on the first codeword to detect a quantity of errors in the first codeword, where determining whether to perform the second read operation may be based on the quantity of errors detected in the first codeword.

Some cases of the method 900 and the apparatus described herein may further include operations, features, means, or instructions for performing, using the second reference voltage, the second read operation on the set of memory cells based on detecting one or more errors within the first codeword.

Some examples of the method 900 and the apparatus described herein may further include operations, features, means, or instructions for outputting the first codeword based on detecting that the first codeword may be free of errors and determining to not perform the second read operation on the set of memory cells.

Some cases of the method 900 and the apparatus described herein may further include operations, features, means, or instructions for determining whether the first reference voltage may be equal to an upper limit of a reference voltage, where determining whether to perform the second read operation may be based on whether the first reference voltage may be equal to the upper limit of the reference voltage.

Some instances of the method 900 and the apparatus described herein may further include operations, features, means, or instructions for performing, using the second reference voltage, the second read operation on the set of memory cells based on determining that the first reference voltage may be less than the upper limit of the reference voltage.

Some examples of the method 900 and the apparatus described herein may further include operations, features, means, or instructions for outputting the second codeword based on determining that the first reference voltage may be equal to the upper limit of the reference voltage and determining to not perform the second read operation on the set of memory cells.

Figure 10:
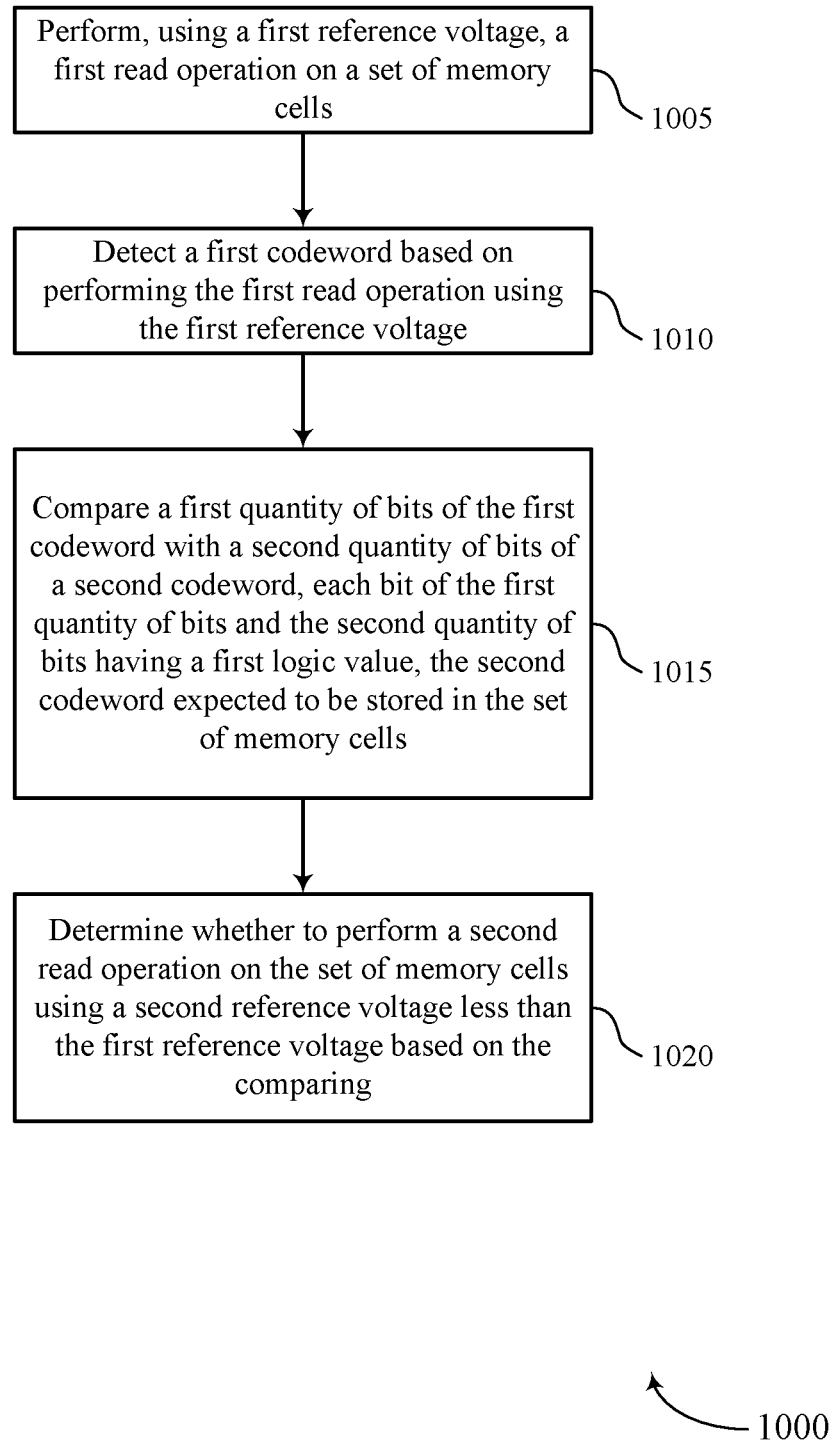

FIG. 10 shows a flowchart illustrating a method or methods 1000 that supports method for setting a reference voltage for read operations in accordance with examples as disclosed herein. The operations of method 1000 may be implemented by a memory device or its components as described herein. For example, the operations of method 1000 may be performed by a memory device as described with reference to FIG. 8. In some examples, a memory device may execute a set of instructions to control the functional elements of the memory device to perform the described functions. Additionally or alternatively, a memory device may perform aspects of the described functions using special-purpose hardware.

At 1005, the memory device may perform, using a first reference voltage, a first read operation on a set of memory cells. The operations of 1005 may be performed according to the methods described herein. In some examples, aspects of the operations of 1005 may be performed by a undefined as described with reference to FIG. 8.

At 1010, the memory device may detect a first codeword based on performing the first read operation using the first reference voltage. The operations of 1010 may be performed according to the methods described herein. In some examples, aspects of the operations of 1010 may be performed by a undefined as described with reference to FIG. 8.

At 1015, the memory device may compare a first quantity of bits of the first codeword with a second quantity of bits of a second codeword, each bit of the first quantity of bits and the second quantity of bits having a first logic value, the second codeword expected to be stored in the set of memory cells. The operations of 1015 may be performed according to the methods described herein. In some examples, aspects of the operations of 1015 may be performed by a undefined as described with reference to FIG. 8.

At 1020, the memory device may determine whether to perform a second read operation on the set of memory cells using a second reference voltage less than the first reference voltage based on the comparing. The operations of 1020 may be performed according to the methods described herein. In some examples, aspects of the operations of 1020 may be performed by a reference voltage manager as described with reference to FIG. 8.

In some examples, an apparatus as described herein may perform a method or methods, such as the method 1000. The apparatus may include features, means, or instructions (e.g., a non-transitory computer-readable medium storing instructions executable by a processor) for performing, using a first reference voltage, a first read operation on a set of memory cells, detecting a first codeword based on performing the first read operation using the first reference voltage, comparing a first quantity of bits of the first codeword with a second quantity of bits of a second codeword, each bit of the first quantity of bits and the second quantity of bits having a first logic value, the second codeword expected to be stored in the set of memory cells, and determining whether to perform a second read operation on the set of memory cells using a second reference voltage less than the first reference voltage based on the comparing.

Some cases of the method 1000 and the apparatus described herein may further include operations, features, means, or instructions for performing, using the second reference voltage, the second read operation on the set of memory cells based on determining to perform the second read operation.

Some instances of the method 1000 and the apparatus described herein may further include operations, features, means, or instructions for identifying that the first quantity of bits having the first logic value may be greater than the second quantity of bits having the first logic value based on the comparing, where performing the second read operation may be based on identifying that the first quantity of bits may be greater than the second quantity of bits.

Some cases of the method 1000 and the apparatus described herein may further include operations, features, means, or instructions for outputting the first codeword based on determining to not perform the second read operation on the set of memory cells.

Some examples of the method 1000 and the apparatus described herein may further include operations, features, means, or instructions for identifying that the first quantity of bits having the first logic value may be the same as the second quantity of bits having the first logic value based on the comparing, where outputting the first codeword may be based on identifying that the first quantity of bits may be the same as the second quantity of bits.

Some cases of the method 1000 and the apparatus described herein may further include operations, features, means, or instructions for identifying that the first quantity of bits having the first logic value may be less than the second quantity of bits having the first logic value based on the comparing, where outputting the first codeword may be based on identifying that the first quantity of bits may be less than the second quantity of bits.

Some instances of the method 1000 and the apparatus described herein may further include operations, features, means, or instructions for performing an error control operation on the first codeword to detect a quantity of errors in the first codeword, where determining whether to perform the second read operation may be based on the quantity of errors detected in the first codeword.

Some examples of the method 1000 and the apparatus described herein may further include operations, features, means, or instructions for performing, using the second reference voltage, the second read operation on the set of memory cells based on detecting one or more errors within the first codeword.

Some cases of the method 1000 and the apparatus described herein may further include operations, features, means, or instructions for outputting the first codeword based on detecting that the first codeword may be free of errors and determining to not perform the second read operation on the set of memory cells.

Some instances of the method 1000 and the apparatus described herein may further include operations, features, means, or instructions for determining whether the first reference voltage may be equal to a lower limit of a reference voltage, where determining whether to perform the second read operation may be based on whether the first reference voltage may be equal to the lower limit of the reference voltage.

Some examples of the method 1000 and the apparatus described herein may further include operations, features, means, or instructions for performing, using the second reference voltage, the second read operation on the set of memory cells based on determining that the first reference voltage may be greater than the lower limit of the reference voltage.

Some cases of the method 1000 and the apparatus described herein may further include operations, features, means, or instructions for outputting the second codeword based on determining that the first reference voltage may be equal to the lower limit of the reference voltage and determining to not perform the second read operation on the set of memory cells.

It should be noted that the methods described herein are possible implementations, and that the operations and the steps may be rearranged or otherwise modified and that other implementations are possible. Furthermore, portions from two or more of the methods may be combined.

An apparatus is described. The apparatus may include a memory array including a set of memory cells, a sense amplifier coupled with the memory array and including a first transistor associated with a first reference voltage and a second transistor associated with a second reference voltage greater than the first reference voltage, and control component (e.g., coupled with the memory array and the sense amplifier). The control component may be configured to cause the apparatus to detect a first codeword based on performing a first read operation of the set of memory cells using the first reference voltage, compare a first quantity of bits of the first codeword with a second quantity of bits of a second codeword, each bit of the first quantity of bits and the second quantity of bits having a first logic value, the second codeword expected to be stored in the set of memory cells, and determine whether to perform a second read operation at the set of memory cells using the second reference voltage based on the comparing.

In some examples, the control component may further be configured to cause the apparatus to perform, using the second reference voltage, the second read operation on the set of memory cells based on determining to perform the second read operation.

In some cases, the control component may further be configured to cause the apparatus to identify that the first quantity of bits having the first logic value may be less than the second quantity of bits having the first logic value based on the comparing, where performing the second read operation may be based on identifying that the first quantity of bits may be less than the second quantity of bits.

In some instances, the control component may further be configured to cause the apparatus to output the first codeword based on determining to not perform the second read operation on the set of memory cells.

In some examples, the control component may further be configured to cause the apparatus to identify that the first quantity of bits having the first logic value may be the same as the second quantity of bits having the first logic value based on the comparing, where outputting the first codeword may be based on identifying that the first quantity of bits may be the same as the second quantity of bits.

In some cases, the control component may further be configured to cause the apparatus to identify that the first quantity of bits having the first logic value may be greater than the second quantity of bits having the first logic value based on the comparing, where outputting the first codeword may be based on identifying that the first quantity of bits may be greater than the second quantity of bits.

In some instances, the sense amplifier may be configured to apply a first voltage to a gate of the first transistor during a third read operation that may be performed prior to the first read operation, output, to the control component, a third codeword that may be different from the first codeword based on applying the first voltage to the gate of the first transistor, where the third codeword may have a third quantity of bits having the first logic value, and apply, during the first read operation, a second voltage greater than the first voltage to the gate of the first transistor based on the third quantity of bits having the first logic value being less than the second quantity of bits having the first logic value.

Some examples of the apparatus may include error control circuitry coupled with the control component and configured to cause the apparatus to perform an error control operation on the second codeword to detect a quantity of errors in the second codeword, and output the detected quantity of errors in the second codeword to the control component, wherein determining whether to perform the second read operation is based at least in part on the error control circuitry outputting the detected quantity of errors to the control component.

In some cases, the control component may further be configured to cause the apparatus to determine whether the first reference voltage may be equal to an upper limit of a reference voltage, where determining whether to perform the second read operation may be based on whether the first reference voltage may be equal to the upper limit of the reference voltage.

In some instances, the first transistor and the second transistor may be arranged in a parallel configuration in the sense amplifier.

An apparatus is described. The apparatus may include a memory array including a set of memory cells and a control component coupled with the memory array. The control component may be operable to cause the apparatus to perform, using a first reference voltage, a first read operation on the set of memory cells, detect a first codeword based on performing the first read operation using the first reference voltage, compare a first quantity of bits of the first codeword with a second quantity of bits of a second codeword, each bit of the first quantity of bits and the second quantity of bits having a first logic value, the second codeword expected to be stored in the set of memory cells, and determine whether to perform a second read operation on the set of memory cells using a second reference voltage greater than the first reference voltage based on the comparing.

In some examples, the control component may further be configured to cause the apparatus to perform, using the second reference voltage, the second read operation on the set of memory cells based on determining to perform the second read operation.

In some cases, the control component may further be configured to cause the apparatus to determine that the first reference voltage may be equal to an upper limit of a reference voltage, determine to not perform the second read operation on the set of memory cells based on the first reference voltage being equal to the upper limit of the reference voltage, and output the first codeword based on determining to not perform the second read operation on the set of memory cells.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals can be communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components from one another, the controller affects a change that prevents signals from flowing between the components using a conductive path that previously permitted signals to flow.

The terms "concurrent" or "concurrently" used herein refer to actions that are at least partially overlapping in time. The terms "simultaneous" or "simultaneously" used herein refer to actions that occur at a same time and, in some examples, begin at a same time, occur for a same duration, and end a same time. Concurrent actions may also be simultaneous actions.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other cases, the substrate may be a silicon-on-insulator (SOI) substrate, such as silicon-on-glass (SOG) or silicon-on-sapphire (SOS), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein but is to be accorded the broadest scope consistent with the principles and novel features disclosed herein.

What is claimed is:

1. A method, comprising:
   receiving, from a host device, a read command for a set of memory cells;
   iteratively performing, based at least in part on receiving the read command, a plurality of first read operations on the set of memory cells to detect a plurality of respective codewords until a first codeword of the plurality of respective codewords comprises a first quantity of bits having a first logic value that satisfies a criteria, wherein each iteration comprises:
      performing one of the plurality of first read operations using a first reference voltage to detect one of the plurality of respective codewords, and
      increasing the first reference voltage for performing a subsequent one of the plurality of first read operations; and
   outputting, to the host device, data that is based at least in part on the first codeword.

2. The method of claim 1, wherein each iteration further comprises:
   comparing, based at least in part on detecting one of the plurality of respective codewords, a second quantity of bits of the one of the plurality of respective codewords with a third quantity of bits of a second codeword, each bit of the second quantity of bits and the third quantity of bits having the first logic value, the second codeword expected to be stored in the set of memory cells.

3. The method of claim 2, wherein the first codeword comprises the first quantity of bits having the first logic value that satisfies the criteria when the first quantity of bits is within a threshold quantity of the third quantity of bits.

4. The method of claim 2, wherein performing the subsequent one of the plurality of first read operations is based at least in part on the second quantity of bits failing to be within a threshold quantity of the third quantity of bits.

5. The method of claim 1, further comprising:
   performing an error control operation on the first codeword to detect a quantity of errors in the first codeword; and
   determining whether to perform a second read operation on the set of memory cells using a second reference voltage greater than the first reference voltage based at least in part on the quantity of errors in the first codeword.

6. The method of claim 5, further comprising:
   identifying, based at least in part on iteratively performing the plurality of first read operations, an upper limit of a reference voltage based at least in part on the first reference voltage, wherein determining whether to perform the second read operation is based at least in part on whether the first reference voltage is equal to the upper limit of the reference voltage.

7. The method of claim 5, further comprising:
   performing, based at least in part on detecting one or more errors within the first codeword, the second read operation on the set of memory cells to detect a second codeword, wherein the data output to the host device comprises the second codeword.

8. The method of claim 5, wherein the data output to the host device is the first codeword based at least in part on detecting that the first codeword is free of errors and determining to not perform the second read operation.

9. The method of claim 1, further comprising:
   performing an error control operation on the first codeword to generate a second codeword, wherein outputting the data to the host device comprises outputting the second codeword to the host device.

10. An apparatus, comprising:
    a memory array comprising a set of memory cells; and
    a control component coupled with the memory array and operable to cause the apparatus to:
       receive, from a host device, a read command for the set of memory cells;
       iteratively perform, based at least in part on receiving the read command, a plurality of first read operations on the set of memory cells to detect a plurality of respective codewords until a first codeword of the plurality of respective codewords comprises a first quantity of bits having a first logic value that satisfies a criteria, wherein for each iteration the control component is further operable to cause the apparatus to:
          perform one of the plurality of first read operations using a first reference voltage to detect one of the plurality of respective codewords, and
          increase the first reference voltage for performing a subsequent one of the plurality of first read operations; and
       output, to the host device, data that is based at least in part on the first codeword.

11. The apparatus of claim 10, wherein to perform each iteration the control component is further operable to cause the apparatus to:
    compare, based at least in part on detecting one of the plurality of respective codewords, a second quantity of bits of the one of the plurality of respective codewords with a third quantity of bits of a second codeword, each bit of the second quantity of bits and the third quantity of bits having the first logic value, the second codeword expected to be stored in the set of memory cells.

12. The apparatus of claim 10, wherein the control component is further operable to cause the apparatus to:
   perform an error control operation on the first codeword to detect a quantity of errors in the first codeword; and
   determine whether to perform a second read operation on the set of memory cells using a second reference voltage greater than the first reference voltage based at least in part on the quantity of errors in the first codeword.

13. The apparatus of claim 12, wherein the control component is further operable to cause the apparatus to:
   identifying, based at least in part on iteratively performing the plurality of first read operations, an upper limit of a reference voltage based at least in part on the first reference voltage, wherein determining whether to perform the second read operation is based at least in part on whether the first reference voltage is equal to the upper limit of the reference voltage.

14. The apparatus of claim 12, wherein the control component is further operable to cause the apparatus to:
   performing, based at least in part on detecting one or more errors within the first codeword, the second read operation on the set of memory cells to detect a second codeword, wherein the data output to the host device comprises the second codeword.

15. The apparatus of claim 12, wherein the data output to the host device is the first codeword based at least in part on detecting that the first codeword is free of errors and determining to not perform the second read operation.

16. A method, comprising:
   receiving, from a host device, a read command for a set of memory cells;
   iteratively performing, based at least in part on receiving the read command, a plurality of first read operations on the set of memory cells to detect a plurality of respective codewords until a first codeword of the plurality of respective codewords comprises a first quantity of bits having a first logic value that satisfies a criteria, wherein each iteration comprises:
      performing one of the plurality of first read operations using a first reference voltage to detect one of the plurality of respective codewords, and
      decreasing the first reference voltage for performing a subsequent one of the plurality of first read operations; and
   outputting, to the host device, data that is based at least in part on the first codeword.

17. The method of claim 16, wherein the first codeword comprises the first quantity of bits having the first logic value that satisfies the criteria when the first quantity of bits is within a threshold quantity of a second quantity of bits having the first logic value in a second codeword, the second codeword expected to be stored in the set of memory cells.

18. The method of claim 16, further comprising:
   performing an error control operation on the first codeword to detect a quantity of errors in the first codeword; and
   determining whether to perform a second read operation on the set of memory cells using a second reference voltage less than the first reference voltage based at least in part on the quantity of errors in the first codeword.

19. The method of claim 18, further comprising:
   identifying, based at least in part on iteratively performing the plurality of first read operations, a lower limit of a reference voltage based at least in part on the first reference voltage, wherein determining whether to perform the second read operation is based at least in part on whether the first reference voltage is equal to the lower limit of the reference voltage.

20. The method of claim 18, further comprising:
   performing, based at least in part on detecting one or more errors within the first codeword, the second read operation on the set of memory cells to detect a second codeword, wherein the data output to the host device comprises the second codeword.

* * * * *